US 6,730,933 B1

(12) United States Patent
Shimizu et al.

(10) Patent No.: US 6,730,933 B1
(45) Date of Patent: May 4, 2004

(54) HYBRID INTEGRATED CIRCUIT DEVICE

(75) Inventors: Hisashi Shimizu, Gunma (JP); Noriaki Sakamoto, Gunma (JP); Yoshiyuki Kobayashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/536,898

(22) Filed: Mar. 28, 2000

(30) Foreign Application Priority Data

Aug. 25, 1999 (JP) ........................................ P. 11-238413

(51) Int. Cl.[7] ............................................... H01L 27/15
(52) U.S. Cl. .............................. 257/79; 257/80; 257/82; 257/89; 257/93; 257/98; 257/99; 257/103
(58) Field of Search ............................... 257/81, 84, 88, 257/92, 93, 98–100, 690, 698

(56) References Cited

U.S. PATENT DOCUMENTS 5,430,484 A * 7/1995 Nagane et al. ............... 348/370
5,886,401 A * 3/1999 Liu ............................. 257/678
5,929,474 A * 7/1999 Huang et al. ................ 257/292

FOREIGN PATENT DOCUMENTS

JP     Hei.9-252651     9/1997

* cited by examiner

*Primary Examiner*—Long Pham
*Assistant Examiner*—Wai-Sing Louie
(74) *Attorney, Agent, or Firm*—Fish & Richardson P.C.

(57) ABSTRACT

In a light irradiation device in which a light emitting element is attached to a printed circuit board, the heat radiation properties are enhanced, and improvement of the light emitting efficiency, reduction of the size and weight, and prevention of temporal changes are realized.

A Cu pattern covered with Ni is formed on a metal substrate 11. Light emitting elements 11 are mounted on the pattern in the form of a series circuit. Metal substrates in each of which the series connection is formed are connected to one another in parallel. Since Ni has excellent corrosion resistance and a high reflection efficiency, the surfaces of the substrates themselves can be used as reflective plates. A lens 37 is formed for each of the light emitting elements, whereby the emission efficiency can be further improved.

A transparent substrate 50 is bonded via a seal 51, and temporal changes of a light emitting element 10 and electrodes which are sealed therein are suppressed.

21 Claims, 6 Drawing Sheets

HYBRID INTEGRATED CIRCUIT DEVICE

BACKGROUND OF THE INVENTION

1. Field of the Invention

The present invention relates to a hybrid integrated circuit device, and more particularly to a light irradiation device in which a plurality of light emitting elements are mounted.

2. Description of the Related Art

When a plant such as a flower or a vegetable is to be irradiated with a large amount of light, a device such as an electric lamp is usually used. In some cases, in order to reduce the size and weight of the device and the power consumption, a device in which light emitting elements 2 are mounted on a printed circuit board 1 as shown in FIG. 6 is used.

As the light emitting elements, light emitting diodes which are configured by semiconductor materials are mainly used. Alternatively, semiconductor lasers or the like may be used.

In each of the light emitting diodes 2, two leads 3 and 4 are used. The rear face (anode or cathode) of a light emitting diode chip 5 is fixed to the one lead 3 by soldering or the like. The other lead 4 is electrically connected via a thin metal wire 6 to an electrode (cathode or anode) on the surface of the chip. A transparent resin sealing member 7 which will serve as a lens is formed to seal the leads 3 and 4, the chip 5, and the thin metal wire 6.

On the other hand, electrodes 8 and 9 for supplying a power to the light emitting diode 2 are disposed on the printed circuit board 1. The leads are inserted into through holes opened in the electrodes. The light emitting diode 2 is mounted on the board via solder or the like.

A light irradiation device using such light emitting diodes is described in, for example, JP-A-9-252651.

As described above, the light emitting element 2 is configured by a package into which the resin sealing member 7, the leads 3 and 4, and the like are incorporated. When a large number of light emitting elements are mounted, therefore, there arise problems such as that the circuit board 1 is large in size and weight. Since the heat radiation properties of the circuit board itself are inferior, the circuit board has a problem in that the temperature of the whole device is excessively raised. Consequently, the temperatures of semiconductor chips themselves which constitute the light emitting elements are raised, thereby producing a problem in that the driving ability is lowered.

In the light emitting diode 2, light is emitted also from side and rear faces, and hence light directed toward the circuit board 1 exists. Since the circuit board 1 is configured by a printed circuit board, there is another problem in that irradiation of a high efficiency cannot be realized.

When such a light emitting element is mounted in the form of a bare shape, the light emitting element deteriorates, thereby producing a problem in that the amount of light is reduced and the light intensity is lowered. Furthermore, also a reflective plate formed on the printed circuit board is oxidized and there arises another problem in that the reflection efficiency is lowered.

SUMMARY OF THE INVENTION

The invention has been conducted in view of the above-discussed problems. An object of the invention is to provide a durable and reliable hybrid integrated circuit device.

First, the problems can be solved by a configuration which has a seal disposed in the periphery of a substrate, and a transparent substrate fixed via the seal.

Since a light emitting element and electrodes are disposed in a sealed space defined by the substrate, the transparent substrate, and the seal, deterioration of properties and oxidation can be prevented from occurring.

Second, the problems can be solved by a configuration comprising: a first electrode which is made of Cu covered with an oxidation resistant metal; a second electrode which is formed on another region of the substrate, and which is made of Cu covered with an oxidation resistant metal; a light emitting element in which a rear face of a chip is electrically fixed to the first electrode; connecting means for electrically connecting the second electrode to an electrode which is on a surface of the light emitting element; a seal which is disposed in a periphery of the substrate; and a transparent substrate which is fixed via the seal.

The second configuration functions in a similar manner as the first means. Particularly, the oxidation resistant films on the electrodes serve as light reflective films, and their glossiness also can be prevented from deteriorating.

Third, the problems can be solved by a configuration in which a plurality of hybrid integrated circuit substrates each of which has a seal disposed in the periphery of the substrate, and a transparent substrate fixed via the seal are arranged, and connecting means for electrically connecting the first and second electrodes on the hybrid integrated circuit substrates with one other is disposed.

In the configuration in which a transparent substrate is disposed for each of the hybrid integrated circuit substrates, even when a light emitting element is broken, each of the hybrid integrated circuit substrates can be independently repaired. When the arrangement angles of the hybrid integrated circuit substrates are adjusted, the substrates can be arranged in a convex or concave shape, so that light can be converged or diverged by the whole arrangement.

Fourth, the problems can be solved by a configuration in which a gas for preventing the light emitting element and/or the electrodes from deteriorating is filled into a space defined by the substrate, the transparent substrate, and the seal.

When the space is filled with nitrogen gas, an inert gas, or the like, deterioration of properties and oxidation of the electrodes can be further prevented from occurring.

Fifth, a spacer which is made of an insulating material is disposed inside the seal, whereby the transparent substrate can be mechanically supported. Even when, for example, the pressure of the space is lowered and the substrates are warped, the transparent substrate is supported, and hence prevented from being broken. Moreover, the thickness of the transparent substrate can be made smaller, so that absorption of light can be further reduced.

Sixth, a light transmitting resin which is formed into a lens-like shape is disposed in the light emitting element, whereby light emitted from the light emitting element can be converged.

Seventh, a top portion of the light transmitting resin abuts against the transparent substrate. According to this configuration, the spacer can be replaced with the resin. As compared with the case where a spacer is separately disposed, the area of the reflecting surface can be made larger.

Eighth, plural hybrid integrated circuit substrates are arranged in a matrix form, and at least end ones of the hybrid integrated circuit substrates are inclined at a predetermined angle with respect to a center one of the hybrid integrated circuit substrates. According to this configuration, it is possible to reflect light emitted in a direction which is substantially parallel to the hybrid integrated circuit substrates. Therefore, the amount of reflected light can be further increased.

Ninth, the seal is made of a glossy material, thereby enabling the seal to perform reflection.

Tenth, in the case where the seal is made of a resin, filling hole for the gas is formed in the seal, whereby the gas can be easily filled into the space, and the filling hole can be readily sealed.

As described above, when a substrate mainly made of Al is employed, particularly, it is possible to realize a light irradiation device which can attain excellent heat radiation properties, light weight, high workability, and improvement of performance, and which can be easily assembled and repaired. Moreover, the inclination can be set for each of the hybrid integrated circuit substrates. Therefore, a convex or concave face can be formed by the whole of the hybrid integrated circuit substrates, so that reflection of a high reflection efficiency can be realized.

DESCRIPTION OF THE PREFERRED EMBODIMENTS

Figure 1:
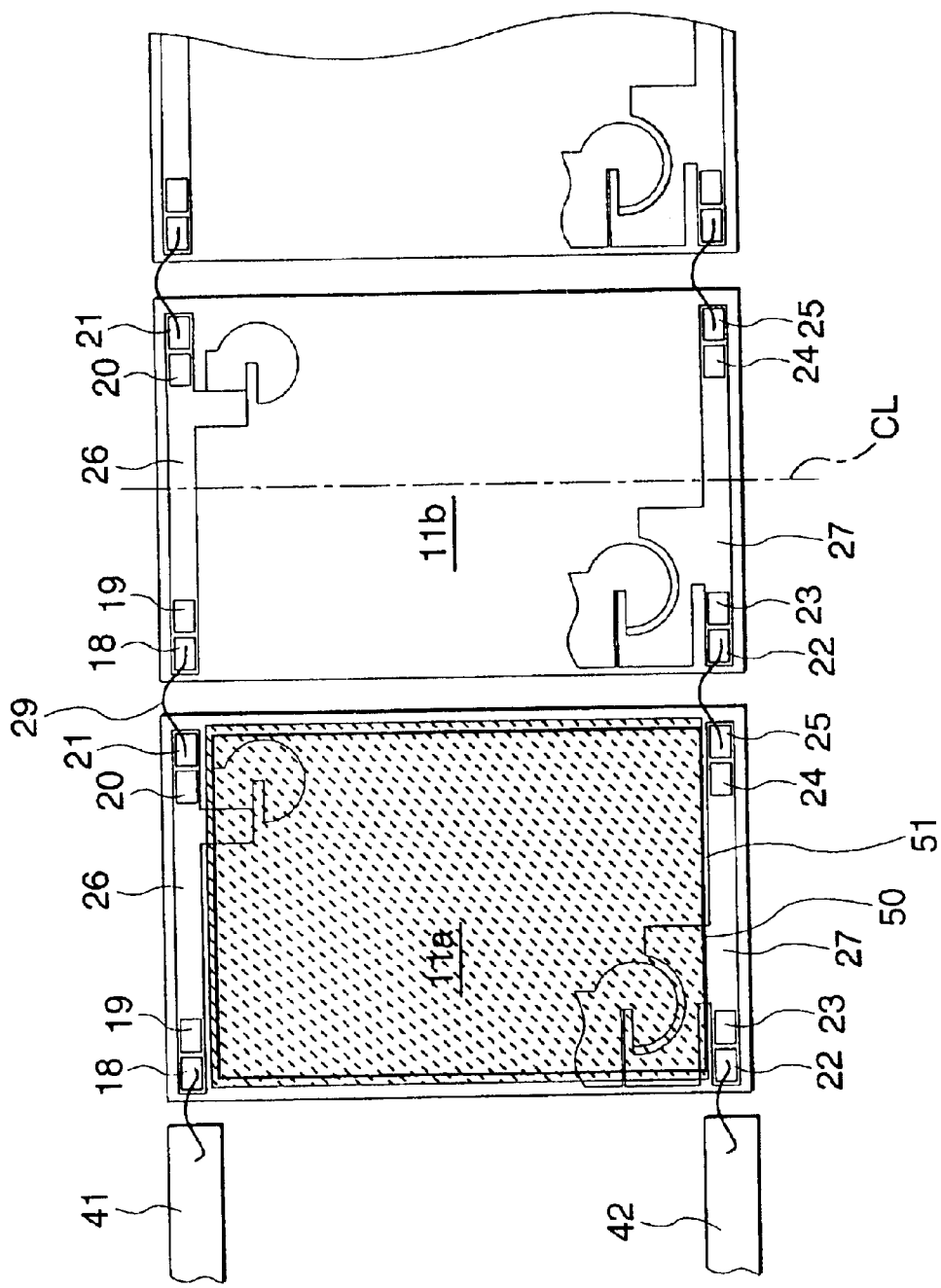
FIG. 1 is a view of a hybrid integrated circuit device of an embodiment of the invention.

Embodiments of the invention will be described with reference to FIGS. 3, 4, and 5. Hereinafter, connection of a light emitting diode 10 will be particularly described. A similar method can be applied also to the case of a semiconductor laser.

A hybrid integrated circuit substrate 11 configured by a metal member which is punched out by a pressing (cutting) work. As the material of the hybrid integrated circuit substrate 11, a metal such as Al, Cu, or Fe may be used.

In the embodiment, a metal substrate is used as the hybrid integrated circuit substrate by reasons including: that heat generated from a light emitting element can be efficiently radiated to the outside; that the temperature of the light emitting element can be prevented from being raised, thereby improving the driving ability; that the flatness of the substrate causes light emitted in a direction other than the upward one to be efficiently reflected by the substrate 11 to be upward directed; and that workability for forming screw holes for mounting, workability for forming a curved face such as a paraboloid, and other workabilities are excellent. Alternatively, a ceramic substrate or a printed circuit board may be used. However, a ceramic substrate has a low impact resistance, and a printed circuit board has low heat radiation properties. Of course, these materials may be employed as required.

In the invention, Al is employed in view of workability and light weight. In this case, in order to improve the insulation properties, an oxide may be formed on the surface by anodic oxidation, and an insulative resin 12 may be formed on the oxide. The anodic oxide film may be omitted. Alternatively, a film other than the film may be produced by a chemical reaction. Since the surface of Al is flat, it is preferable to produce a rough face 13 mechanically or chemically in order to improve the adhesiveness between the substrate and the insulative resin, and the rough face is preferably covered with an insulative resin.

The rear face of the Al substrate 11 is mechanically weak to be easily damaged, and has no resistance to corrosion. Therefore, the rear face may be covered with a film of an insulative resin 14 as required. In this case, in order to improve the thermal resistance, the film thickness is preferably set to be 10 $\mu$m or less.

Since the hybrid integrated circuit substrate 11 is electrically conductive, the whole face of the substrate is covered with the insulative resin 12 in view of a short circuit with first and second electrodes 15 and 16 which are formed on the substrate.

In a process of transmitting heat generated from a light emitting diode to the metal substrate 11, the insulative resin film 12 functions as a thermal resistance material. In order to reduce the thermal resistance as far as possible, an insulative resin which is mixed with a filler such as an Si oxide film or aluminum oxide is employed. It is a matter of course that the thermal resistance is lower in the case of aluminum oxide.

The connecting electrodes 15 and 16 are made of, for example, Cu foil, and are formed as wirings, a land for a chip, a pad for bonding, and, as required, a fixing pad for an external lead. A bare light emitting diode 10 is disposed on the first electrode 15. The rear face of a light emitting diode chip is configured as one of two types, or the cathode type and the anode type. In the embodiment, the rear face is configured as the anode type. When the direction of the power supply is reversed, the cathode type may be used.

In order to cause the device to function as a light irradiation device, the light emitting diodes 10 are disposed in a scattered manner as described above. In FIG. 3, a driving circuit for the light emitting diodes is externally disposed. Alternatively, as indicated by C in FIG. 4, such a driving circuit may be mounted on the metal substrate 11. In the alternative, wirings, lands, bonding pads, pads for external electrical connection, and the like are patterned in the periphery of the substrate, particularly in the corners and their vicinities, and components such as chip capacitors, chip resistors, and printed resistors, transistors, diodes, and ICs are electrically connected between the wirings, thereby realizing the circuits. Packaged elements may be mounted. However, bare chip elements are superior from the viewpoints of heat radiation properties and mounting area. These elements will be generally referred to as circuit elements.

These circuit elements are electrically fixed via, for example, a brazing material such as solder, or silver paste, and the printed resistors are formed by screen printing. In order to electrically connect the semiconductor chips to the wirings, the thin metal wires 17 are electrically connected between the electrodes on the chips and the bonding pads, and, as required, external leads are electrically connected to the pads via solder. In view of mounting, at least two screwing holes may be opened in the sides of the substrate.

Figure 2:
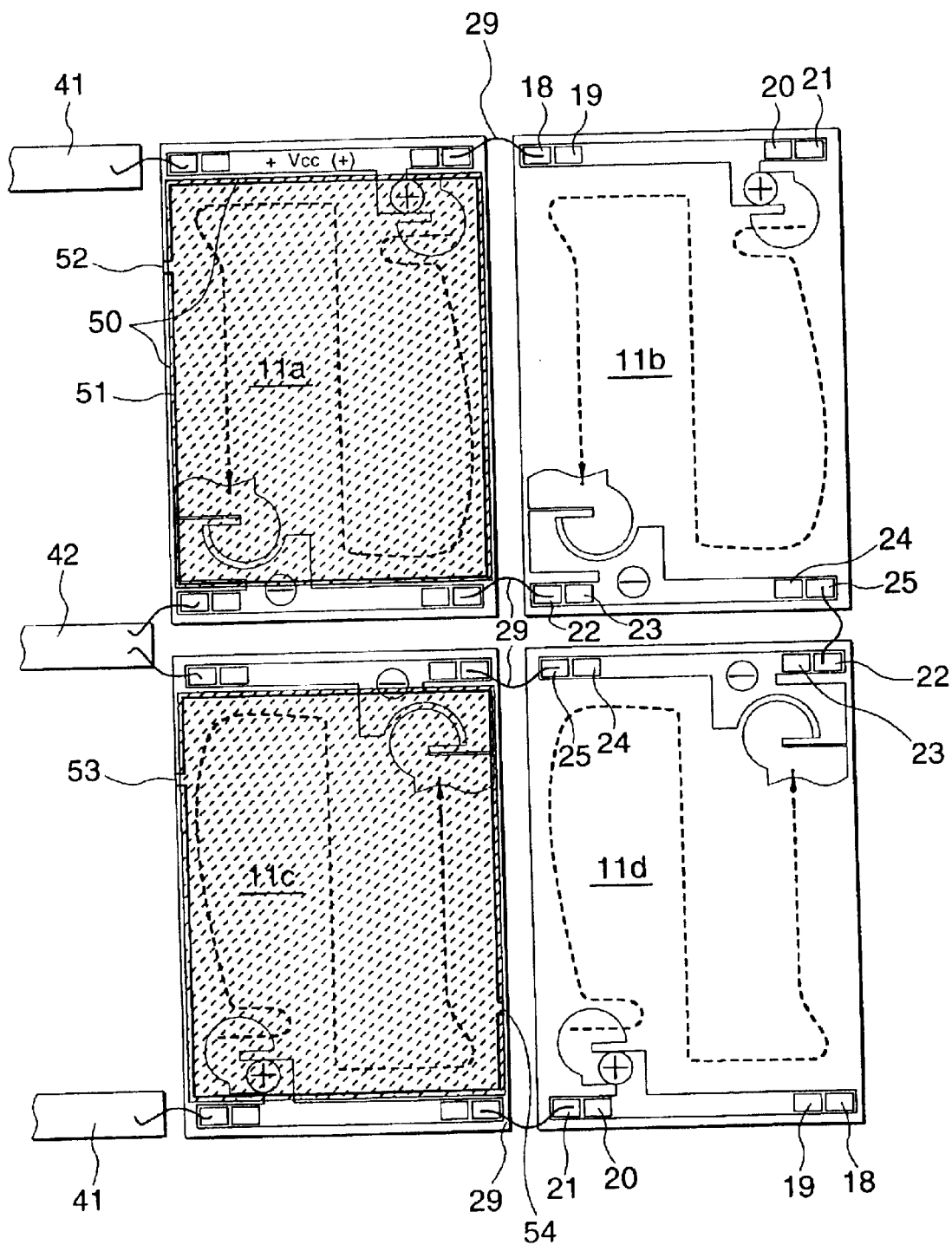
FIG. 2 is a view of a hybrid integrated circuit device of an embodiment of the invention.

As shown in FIG. 1 or 2, the hybrid integrated circuit substrates 11 are arranged in a matrix form as described later. Therefore, connection areas 18 to 21 are disposed in both the ends of the first wiring 26, and connection areas 22 to 25 are disposed in both the ends of the second wiring 27. In the case where connecting means 20 and 30 are thin metal wires, these areas are configured as bonding areas, and, in the case where the means are leads which can be fixed by a brazing material, the areas are configured as areas to be covered with solder.

Alternatively, the Cu pattern on the metal substrate 11 may be realized by bonding a pattern to an insulative flexible sheet, and then bonding the flexible sheet to a hybrid integrated circuit substrate.

The specific structure will be further described with reference to FIG. 3.

As described above, the whole face of the metal substrate 11 is covered with the film of the insulative resin 12. In the figure, in addition to the first and second electrodes 15 and 16, island-like reflection electrodes 31 to 36 are disposed. Of course, in consideration of a short circuit the electrodes are separated from one another by a predetermined distance. In this case, the driving circuit is not mounted. The two metal electrodes 15 and 16 may be disposed so as to respectively cover halves of the substrate 11. Specifically, the electrode 15 may be an anode electrode, the electrode 16 may be a cathode electrode, and the electrodes of the two types may be alternatingly arranged so as to substantially occupy the hybrid integrated circuit substrate 11.

For example, a first electrode 15a or a first electrode 16a may be integrated with the reflection electrode 31. By contrast, the formation of the reflection electrode 31 between the electrodes improves the dielectric properties.

In the first and second electrodes 15 and 16, the surface of Cu is covered with Ni. This is conducted in order to prevent Cu from being oxidized. The light reflection efficiency is lowered by oxidation. Therefore, Ni which is relatively hardly oxidized, excellent in light reflection property, and glossy is employed in view of also the properties of bonding with respect to a thin metal wire. In the invention, Ni or Au which is glossy is employed. In the invention, Ni is employed from the viewpoint of cost. A substantially whole area of the other metal substrate 11 is covered with Ni having substantial glossiness so as to be used as a reflective plate. In each boding point only, a bondable material (Al, Ni, Cu, or Au) may be formed, and other portions may be covered with a material which easily reflects light, such as silver or platinum.

In the case where Ni is employed, the contact resistance with respect to the first electrode 15 is considered. Therefore, Ni of the region of fixing the land is removed away, and the light emitting diode 10 in the form of a bare chip is electrically fixed to Cu via a conductive fixing material such as silver paste or solder. The light emitting diode 10 is connected to the second electrode 16 via the electrode on the chip surface and the thin metal wire 17. In the case where Al is employed as a thin metal wire, the Al wire can be usually connected to the surface of Ni by a bonding operation based on an ultrasonic wave.

Figure 5:
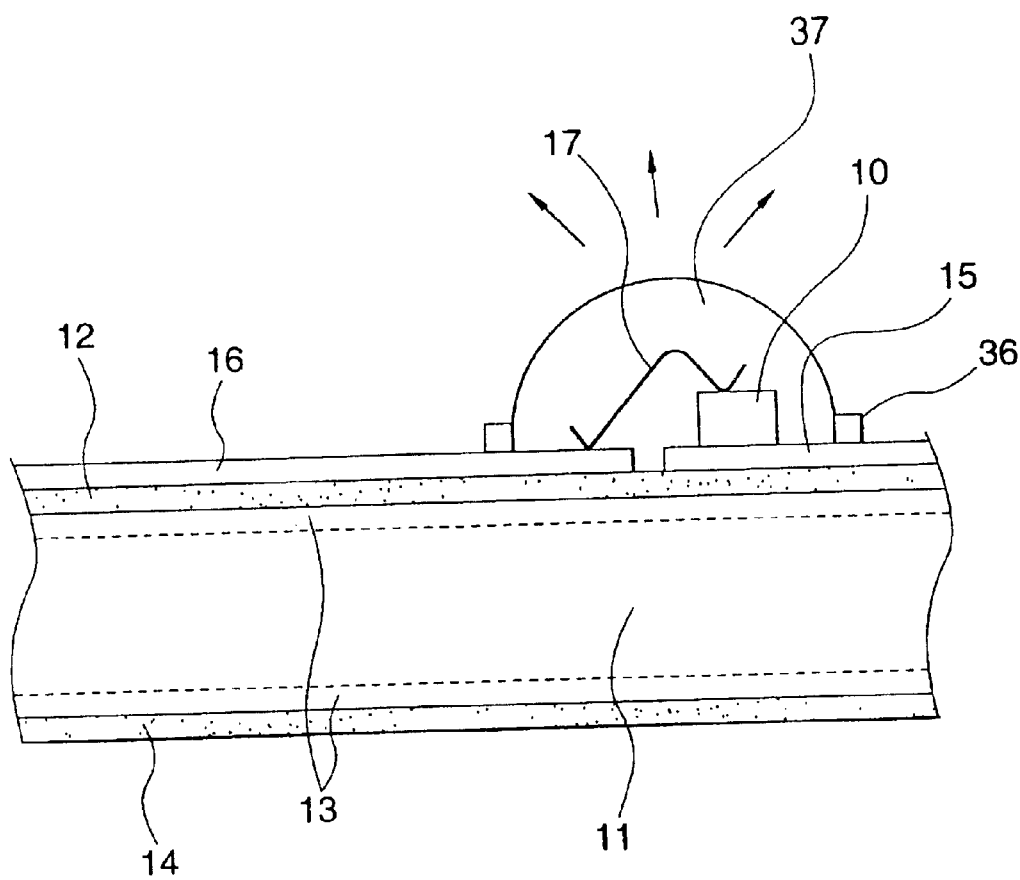
FIG. 5 is a view illustrating a hybrid integrated circuit substrate.
Figure 6:
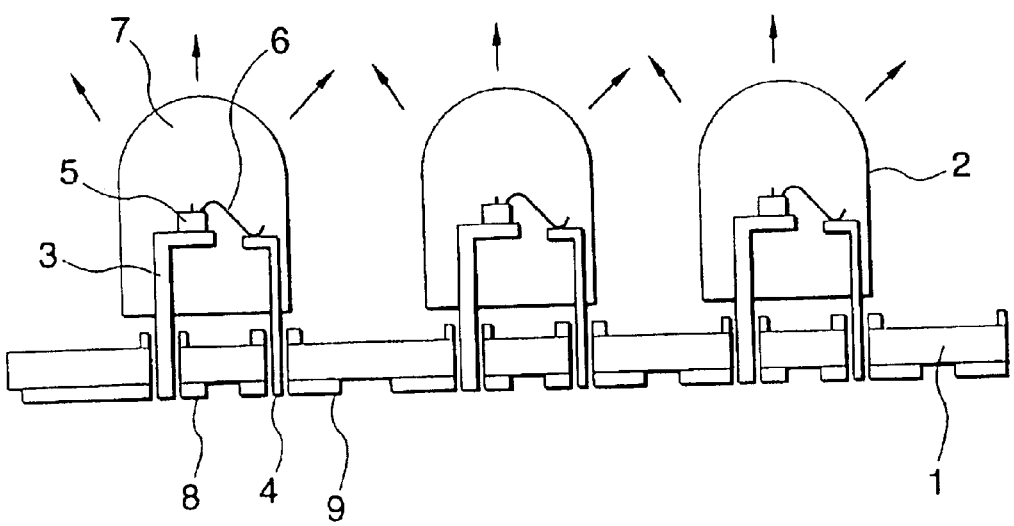
FIG. 6 is a view illustrating an irradiation device of the conventional art.

As shown in FIG. 5, a light transmitting resin 37 is disposed so as to seal at least the light emitting diode 10. The resin is employed as a lens, and formed into a protruding shape so that upward emission from the substrate is efficiently performed. As the material of the lens 37, any resin may be used as far as it is transparent to light. In the embodiment, a silicone resin, an epoxy resin, or the like is employed. Both the resins are of the heat curing type, and exhibit a low viscosity during a heat curing process. Therefore, the resins cannot be stably formed into a hemisphere shape which is preferably used as a lens. A silicone resin is originally in a liquid state, and its viscosity is not largely changed even during a heat curing process. The viscosity of an epoxy resin is lowered during a heat curing process. In the invention, consequently, flow-stopping means 36 is formed so as to surround the light emitting diode 10 as shown in FIG. 5.

The color of an epoxy resin is gradually changed to yellow by heat. By contrast, the degree of color change in a silicone resin is low. An epoxy resin has excellent wettability. Conversely, a silicone resin has high repellent properties. A cured silicone resin is in a rubber-like or gel state, so that stress exerted on the thin metal wire serving as connecting means for a circuit element is smaller as compared with the case of an epoxy resin.

When a silicone resin is used as the flow-stopping means, a resin (a silicone resin or an epoxy resin) stored inside the means is easily repelled to be formed into a lens-like shape by means of the surface tension. By contrast, when an epoxy resin is used as the flow-stopping means, the resin is hardly formed into a lens-like shape because of high repellent properties. The lens is provisionally cured at about 100 to 150 deg. C, and then again heated at 150 deg. C for one hour to be completely cured. In this case, the curing temperature also is important. Since the light emitting elements, semiconductor chips, and the like are fixed by a brazing material, it is preferable not to use a resin of a curing temperature which is higher than that of the brazing material.

Depending on the size of the lens, the portion from the middle of the thin metal wire 17 to the portion where the wire is connected to the second electrode 16 is not covered with the resin sealing member, or the whole of the wire is completely covered with the resin as shown in FIG. 5. When the wire is completely covered with the resin, also improvement of the reliability of the connecting portion of the thin metal wire can be attained together with that of the light collecting ability.

The lens may be formed into a two-stage shape. This configuration is conducted in order to enhance the directivity of the lens. For attaining the two-stage shape, a silicone resin of low wettability is employed because the lens shape cannot be realized unless the wettability is particularly inferior.

Sometimes, a resin film or a so-called solder resist may be formed over the whole face. In this case, when a film which is as glossy as possible is selected, the film can be used as a reflective film in the same manner as Ni. It is a matter of course that the film in the region of fixing the light emitting diode and the connecting portion of the thin metal wire is removed away. When the film is transparent, Ni functions as the main reflective member. When the film is colored, the color of the film is preferably set to white from the viewpoint of reflection efficiency.

Figure 3:
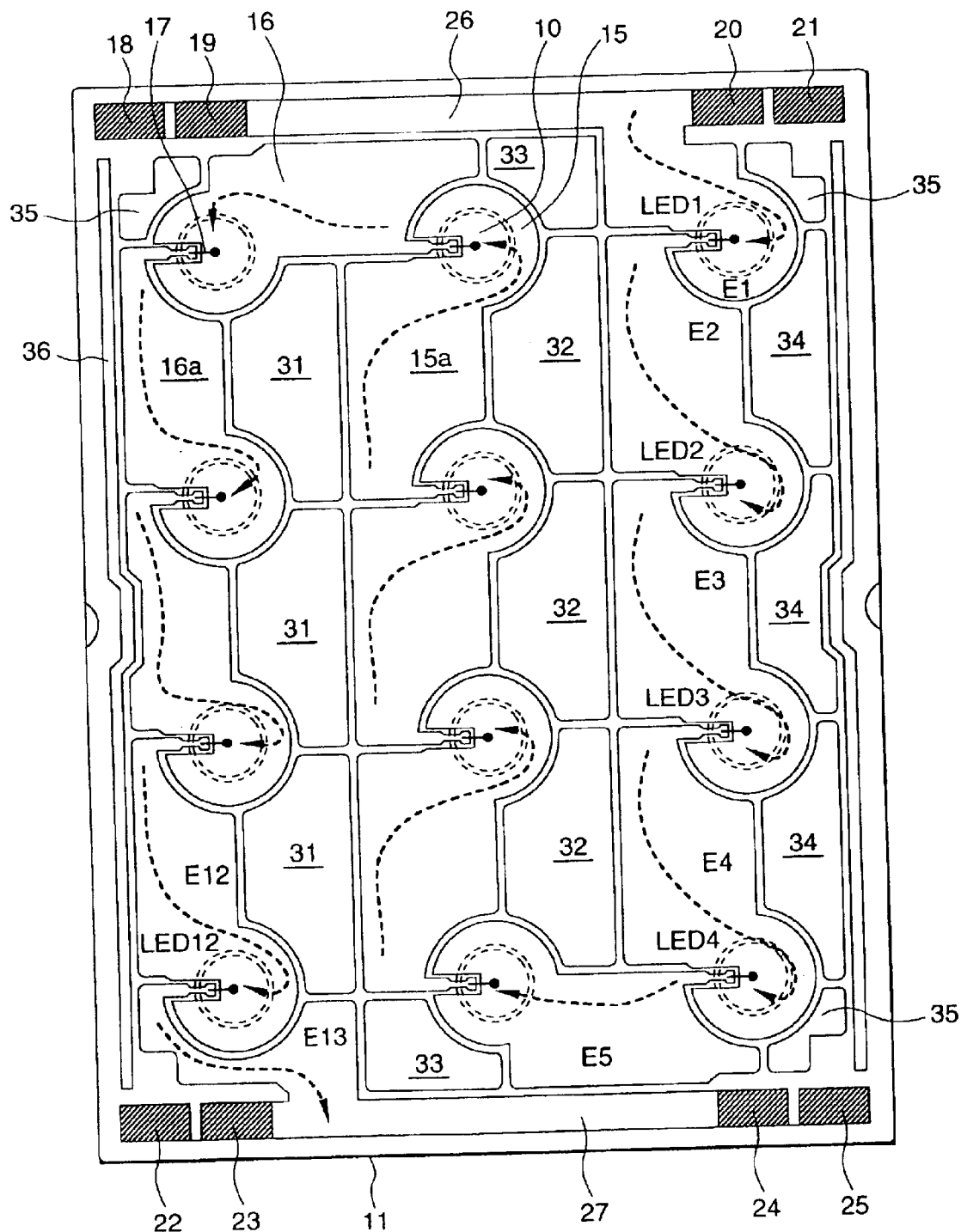
FIG. 3 is a view illustrating a hybrid integrated circuit substrate.
Figure 4:
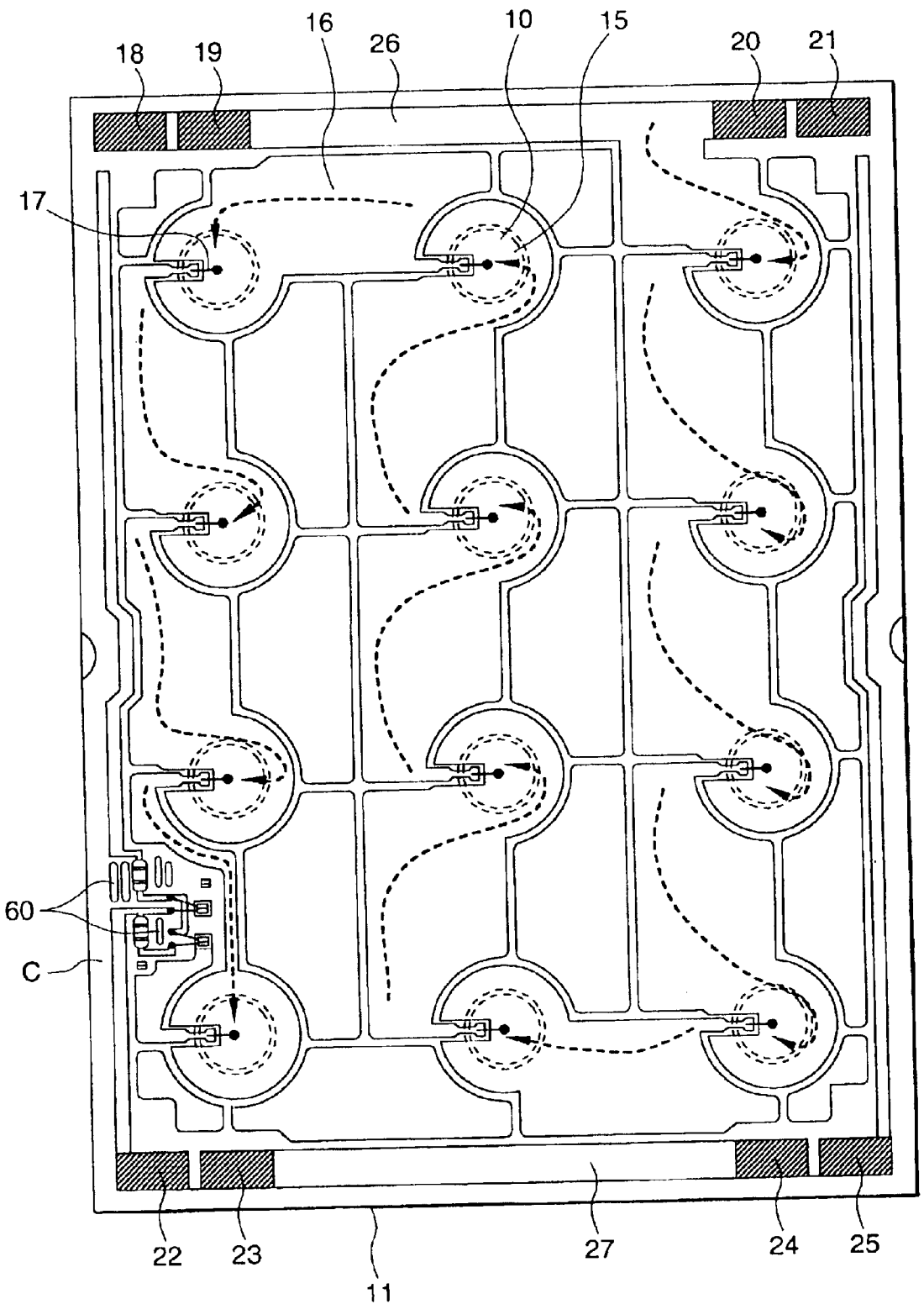
FIG. 4 is a view illustrating a hybrid integrated circuit substrate.

As indicated by the broken line arrows in FIGS. 3 and 4, the light emitting diodes 10 are connected in series between the first and second electrodes 15 and 16.

When a parallel structure is used, for example, the contact resistances of the thin metal wires 17 and the chips are scattered. Consequently, a current is concentrated on a light emitting diode having a low contact resistance, among the many light emitting diodes 10, thereby causing a problem in that the specific light emitting diode is abnormally bright or finally broken.

To comply with the above, the light emitting diodes 10 are connected in series between the first and second wirings 26 and 27 as shown in FIGS. 3 and 4, so that the currents flowing through the light emitting diodes 10 are constant in level.

In the same manner as the above description, the configurations such as that electrodes are arranged over a substantially whole area of the metal substrate to serve as a reflective plate, that lenses are employed, and that Ni in die bonding regions is removed away are employed also in this example.

Thirteen electrodes are formed between the first and second wirings 26 and 27. First, the chip rear face serving as the anode (or the cathode) of the light emitting diode LED1 is fixed to the first electrode E1, and the electrode on the side of the cathode (or the anode) is connected to the second electrode E2 by a thin metal wire 17. The chip rear face of the second light emitting diode LED2 is fixed to the second electrode E2, and the electrode on the chip surface is connected to the third electrode E3 by a thin metal wire. Furthermore, the chip rear face of the third light emitting diode LED3 is fixed to the third electrode E3, and the electrode on the chip surface is connected to the fourth electrode E4 by a thin metal wire. In this way, the light emitting diodes are sequentially connected in series so that the chip rear face of an N-th light emitting diode LED(N) is fixed to an N-th electrode E(N), and finally the electrode on the chip surface is connected to an (N+1)-th electrode E(N+1) by a thin metal wire.

The series connection is realized by repeating the connecting mode. Also in this case, in order to cause the electrodes made of copper foil to serve as reflective plates, the surfaces of the electrodes E1 to E(N+1) are covered with Ni, and, in order to cause the whole area of the substrate to substantially serve as a reflective plate, the patterning is performed so that the substrate is completely covered with the (N+1) electrodes, or, in the case where the substrate is not completely covered with the electrodes, the island-like reflection electrodes 31 to 36 are disposed in open regions. Of course, a small gap is formed so that the electrodes are separated from one another in the pattern.

In the structure, the currents flowing through the series-connected light emitting diodes are theoretically equal to one another in level, and hence all the light emitting diodes emit light in the same manner.

When one of the light emitting diodes is broken and no current flows, all the light emitting diodes stop the light emission.

As shown in FIGS. 1 and 2, therefore, substrates of FIG. 4 are connected in parallel between a Vcc line 41 and a GND line 42.

In the case where a light irradiation device is originally to be realized by, for example, 120 (M) light emitting diodes, the light emitting diodes are divided into, for example, 10 (S) sections, 10 (S) metal substrates in each of which 12 (M/S) light emitting diodes are connected in series are prepared, and the substrates are connected in parallel. When a metal substrate of FIG. 4 is employed, a constant current circuit C is disposed, so that the current capacities of all the light emitting diodes can be unified. Also in the case of FIG. 3, a constant current circuit may be employed. In this case, however, the circuit must be externally disposed on the input or output side of the light emitting diodes.

As described above, in each of the plural metal substrates in which the light emitting diodes are connected in series, the current level is determined by the constant current circuit, and hence the brightnesses of all the light emitting diodes are unified. Furthermore, also the brightnesses of the metal substrates are unified. Even when one of the light emitting diodes in any one of the hybrid integrated circuit substrates is broken, the function as an irradiation device can be maintained because the remaining substrates are connected in parallel. It is required to replace only the broken metal substrate with a new one, and hence the repair is requested only to be performed at the minimum degree.

Hereinafter, the position and shape of the first and second wirings 26 and 27 will be described.

The wirings 26 and 27 are respectively disposed in the upper and lower sides of the hybrid integrated circuit substrate 11, so as to function as power supply lines. Both the wirings elongate from the left end to the right end. Specifically, in order to laterally connect a plurality of hybrid integrated circuit substrates 11 in parallel, the first and second wirings 26 and 27 elongate from the right sides of the corresponding hybrid integrated circuit substrate to the left side as shown in FIG. 1. As a result, the right end 21 of the first wiring 26 (or the second wiring 27) of a hybrid integrated circuit substrate 11a, and the left end 18 of the first wiring 26 (or the second wiring 27) of a hybrid integrated circuit substrate 11b can be connected to each other via the shortest distance. In this example, thin metal wires are used as connecting means 29. Alternatively, the connecting means may be realized by leads, plates, or the like which can be fixed by a brazing material such as solder.

If the plural hybrid integrated circuit substrates 11 are realized by a single substrate, a fault due to a breakage of one of the light emitting diodes cannot be repaired, and there arise further problems in that fixation of the connecting means cannot be performed by an automatic producing machine, and that the fixation requires a production facility of a large scale. The latter problem is raised because of the following reasons. Naturally, the hybrid integrated circuit substrate is large. Therefore, a chip mounter which mounts a chip, and a bonder which performs a die bonding process on a thin metal wire must be realized as machines which have a wide working area. As a hybrid integrated circuit substrate is larger, the thermal capacity of the substrate is greater, and hence the temperature of the substrate itself is more hardly raised. As a result, there arises a problem in that the solderability and the bondability are lowered.

By contrast, in the invention, a parallel connection structure is employed, and the device is configured by plural hybrid integrated circuit substrates. Therefore, the workability of the device is identical with that of the conventional art. Since the hybrid integrated circuit substrates have a small size, the temperature of each substrate can be independently raised, so that the solderability and the bondability are improved.

The first or second wiring 26 or 27 is formed in a bilaterally symmetrical manner with respect to the center line Cl.

In the case of the above configuration, advantages are obtained when a plurality of the arrangements of FIG. 1 are vertically arranged so as to form a matrix as shown in FIG. 2.

For the sake of simplicity of the figure, a matrix of two rows and two columns will be described. In each of the hybrid integrated circuit substrates 11a and 11b of the first row, the first wiring 26 is placed along the upper side of the substrate, and, in each of the hybrid integrated circuit substrates 11c and 11d of the second row, the first wiring 26 is placed along the lower side. Namely, in order to reduce the total number of the Vcc lines 41 and the GND lines 42, the hybrid integrated circuit substrates are arranged in a 180-deg rotated manner. In FIG. 2, although four lines are originally required, the device can be realized by using three lines.

When the hybrid integrated circuit substrate 11*d* is rotated, the connection area 22 of the substrate, and the connection area 25 of the hybrid integrated circuit substrate 11*b* coincide with each other in the direction of the ordinate. This configuration can be realized by forming the substrates so as to be bilaterally symmetrical with respect to the center line.

According to this configuration, the connection area 25 (or the connection area 24) of the hybrid integrated circuit substrate 11*b* positionally coincides with the connection area 22 (or the connection area 23) of the hybrid integrated circuit substrate 11*d*, and can be vertically connected to each other by the shortest distance via the connecting means 30.

This means also that the connection area 22 (or the connection area 23) of the hybrid integrated circuit substrate 11*b* positionally coincides with the connection area 25 (or the connection area 24) of the hybrid integrated circuit substrate 11*d*, and the areas can be vertically connected to each other via the connecting means 30.

Two connection areas are disposed in each of the ends of the wirings 26 and 27. In this example, this configuration is not particularly necessary because the hybrid integrated circuit substrates 11 are arranged in two rows and two columns. When a larger number of hybrid integrated circuit substrates are arranged in the lateral direction, the connecting means 29 for laterally connecting the substrates is connected to the respective hybrid integrated circuit substrates, but some of the substrates fail to be longitudinally connected to each other via the connecting means 30. In FIG. 2, the wirings are fixed to GND via the connecting means 301. When connection in the longitudinal direction also is made by using surplus areas, the wirings can be fixed to a more stable potential.

The rectangles are shown in the wirings 26 and 27 because, when a thin metal wire is used as connecting means, the copper wirings are covered with Ni, and, when leads are used, the wirings are covered with a brazing material. The rectangles show the covering regions. Namely, the covering regions of a brazing material or Ni are indicated by the connecting means.

In order to set the upper side to Vcc and the lower side to GND, the hybrid integrated circuit substrates 11 are arranged so that an odd number of substrates are placed in the column direction. As seen from FIG. 4, when connection between the first wiring 26 and the second wiring 27 in the lower side is to be made, a simple pattern cannot be attained unless columns each consisting of four light emitting diodes LED1 to LED4 are arranged in an odd number. Also in the case where an even number of columns are arranged, the connection to the second wiring 27 in the lower side is enabled. In this case, however, the end exists on the side of the first wiring 26, and hence an excess wiring for connecting the end to the second wiring is required.

When the hybrid integrated circuit substrates 11 of a relatively small size are arranged in parallel or, as required, in a matrix form as described above, the whole irradiation device can be set to have an arbitrary size. Any shape other than a rectangle may be realized by sequentially arranging such hybrid integrated circuit substrates, and connecting the substrates in parallel.

The invention is characterized also in that a transparent substrate 50 is bonded as shown in FIGS. 1 and 2. In the embodiment, a glass substrate 50 is bonded via a seal 51.

A space is formed by the hybrid integrated circuit substrate 11, the transparent substrate 50, and the seal 51. The light emitting elements 10 are sealed in the space, and also the electrodes are substantially sealed. As a result, the light emitting elements can be prevented from deteriorating, and the electrodes can be prevented from being oxidized.

Even when air exists in the space, oxidation can be restricted to a low degree because the amount of the air is limited. Therefore, deterioration and oxidation which advance with the passage of time can be terminated in their middles. When deterioration and oxidation are to be inhibited from the beginning, it is preferable to use a gas which does not deteriorate the light emitting elements nor oxidize the electrodes. For example, an inert gas or the like may be selected as an example of such a gas.

In order to fill the gas into the space, for example, a single filling hole 52 may be formed in the seal 51 (the substrate 11*a* in the upper left portion of FIG. 2), or two filling holes 53 and 54 may be formed in the seal 51 (the substrate 11*c* in the lower left portion of FIG. 2).

In the latter case, the gas is introduced through the one filling hole 53, and the air existing in the space is discharged through the other filling hole 54, and, after the air in the space is replaced with the gas, the filling holes are closed by a resin or the like.

In the former case, a special method is employed because there is only one filling hole. The device is placed in a vacuum apparatus, and the interior of the apparatus including the space is evacuated. Thereafter, the gas is introduced into the vacuum apparatus. The gas is filled into the space because of its vacuum. The filling hole 52 is then closed by a resin or the like.

In the former case, the air in the space is evacuated more slowly in the evacuation process, and hence the transparent substrate may be warped by a pressure difference. In order to suppress absorption of light as far as possible, the transparent substrate has preferably a reduced thickness. Therefore, the mechanical strength of the transparent substrate is lowered. As a result, a spacer must be disposed. The spacer may be formed by a patterning process using a photoresist, or by spraying a transparent liquid.

Alternatively, the lens 37 made of a resin may be used as the spacer.

The position where the seal 51 is to be formed is basically determined so that the light emitting elements are sealed. The first and second wirings 26 and 27 must be positioned outside the seal. Referring to FIG. 3, the gap portion adjacent to the lower side of the first wiring 26 may be widened, and the seal may be formed in the gap. On the side of the second wiring also, the seal may be similarly formed. The longitudinal portions of the seal may be formed at a position where the seal is not contacted with any electrode. According to this configuration, the electrodes can be accommodated in the space as far as possible.

The seal has a protruding shape, and hence can be used as a reflecting surface. Therefore, the seal is made of a material in which the surface is glossy. If a countermeasure against a short circuit is taken, the seal can be naturally made of a brazing material. In this case, a metal film having relatively high wettability with respect to the brazing material is formed in a position where the seal is to be formed.

When the transparent substrate 50 is bonded to each of the hybrid integrated circuit substrates 11 as shown in FIG. 1, there is an advantage in that the arrangement angles of the hybrid integrated circuit substrates 11 can be adjusted.

Figure 7:
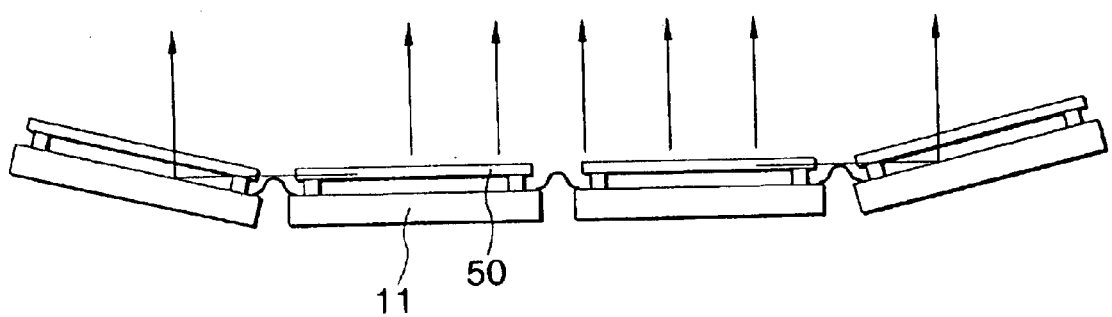
FIG. 7 is a view illustrating a hybrid integrated circuit device in which hybrid integrated circuit substrates are inclined.

Originally, the hybrid integrated circuit device is an irradiation device. In some cases, such a device is used for concentrally irradiate a specific area, or, in other cases, for irradiating a wide area. FIG. 7 shows a configuration in which a plurality of hybrid integrated circuit substrates 11 are arranged in one row in the same manner as FIG. 1, and their inclinations are made larger as further moving toward the ends, whereby the section of the whole device is formed into that of a concave mirror. Of course, the section of the whole device may be formed into that of a convex mirror. Such a configuration is realized by configuring the connecting means 29 with a deformable material. As a result, as indicated by the arrows, even light which is directed in a substantially horizontal direction can be reflected by the hybrid integrated circuit substrates, whereby a device of a high reflection efficiency can be realized.

The above-described configuration is applicable also to the device of FIG. 2 in which the substrates are arranged in a matrix form. In this case, inclination is formed in vertical and lateral directions so as to realize a paraboloid. And an object to be heated should be disposed in a focus of the paraboloid surface. Therefore, very efficient heating can be performed. The whole area where a plurality of hybrid integrated circuit substrates are arranged may be sealed by a single transparent substrate. In this case, a glass plate is large in size, and hence the thickness must be made relatively large in order to maintain the strength. This results in a thick transparent substrate. Consequently, the light absorptance is increased, so that the amount of light which is passed through the transparent substrate to be emitted to the outside is decreased.

When inclination is formed as shown in FIG. 7, the thickness must be increased by the degree corresponding to the inclination in order to attain the sealing due to the transparent substrate. As a result, the device is a very bulky article which is large in size and weight.

In the invention, a transparent substrate is bonded to each of the hybrid integrated circuit substrates. Therefore, it is possible to realize a device in which the substrates can be independently replaced with another one, the angles of the substrates can be adjusted, the whole assembly is small in size and weight, and temporal changes of the amount of emitted light can be suppressed.

In the embodiments described above, a metal substrate is used. In order that properties are prevented from deteriorating by employing a transparent substrate, a substrate of another kind, such as an insulative substrate, a printed circuit board, a ceramic substrate, or a glass substrate may be used. Preferably a glass substrate should be used so as to be same as a substrate in order to prevent a damage caused by a difference between a transparent substrate and the substrate.

As seen from the above description, first, since a light emitting element and electrodes are disposed in a sealed space defined by the substrate, the transparent substrate, and the seal, deterioration of properties and oxidation can be prevented from occurring.

The second configuration functions in a similar manner as the first means. Particularly, the oxidation resistant films on the electrodes serve as light reflective films, and their glossiness can be prevented from deteriorating.

Third, in the configuration in which a transparent substrate is disposed for each of the hybrid integrated circuit substrates, even when a light emitting element is broken, each of the hybrid integrated circuit substrates can be independently repaired. When the arrangement angles of the hybrid integrated circuit substrates are adjusted, the device can be provided with flexibility in which the substrates can be arranged in a convex or concave shape, so that light can be converged or diverged by the whole arrangement.

Fourth, when the space is filled with nitrogen gas, an inert gas, or the like, the properties of the light emitting element and the electrodes can be further prevented from deteriorating.

Fifth, a spacer which is made of an insulating material is disposed inside the seal, whereby the transparent substrate can be mechanically supported. Even when, for example, the pressure of the space is lowered and the substrates are warped, the transparent substrate is supported, and hence prevented from being broken. Moreover, the thickness of the transparent substrate can be made smaller, so that absorption of light can be further reduced.

Sixth, a light transmitting resin which is formed into a lens-like shape is disposed in the light emitting element, whereby light emitted from the light emitting element can be converged.

Seventh, a top portion of the light transmitting resin abuts against the transparent substrate. According to this configuration, the spacer can be replaced with the resin. As compared with the case where a spacer is separately disposed, the area of the reflecting surface can be made larger.

Eighth, plural hybrid integrated circuit substrates are arranged in a matrix form, and at least end ones of the hybrid integrated circuit substrates are inclined at a predetermined angle with respect to a center one of the hybrid integrated circuit substrates. According to this configuration, it is possible to reflect light emitted in a direction which is substantially parallel to the hybrid integrated circuit substrates. Therefore, the amount of reflected light can be further increased.

Ninth, the seal is made of a glossy material, thereby enabling the seal to perform reflection.

Tenth, in the case where the seal is made of a resin, a filling hole for the gas is formed in the seal, whereby the gas can be easily filled into the space, and the filling hole can be readily sealed.

As described above, when a substrate mainly made of Al is employed, particularly, it is possible to realize a light irradiation device which can attain excellent heat radiation properties, light weight, high workability, and improvement of performance, and which can be easily assembled and repaired. Moreover, the inclination can be set for each of the hybrid integrated circuit substrates. Therefore, a convex or concave face can be formed by the whole of the hybrid integrated circuit substrates, so that reflection of a high reflection efficiency can be realized.

Further the transparent substrate can be separated from a top portion of said light transmitting resin. Even if the substrate is vibrated, the resin can protect the wiring from a shock without crashing to the transparent substrate.

What is claimed is:

1. A hybrid integrated circuit device comprising:
   a hybrid integrated circuit substrate in which at least a surface is provided with insulation;
   at least a first electrode and at least a second electrode formed on said surface and being disposed to cover substantially the substrate;
   a light emitting element connected with the first and second electrodes, said first and second electrodes configured to reflect light;
   a seal which is disposed in a periphery of said substrate; and
   a transparent substrate which is fixed to said hybrid integrated circuit substrate via said seal to enclose the first and second electrodes and the light emitting element within a sealed space formed between said hybrid integrated circuit substrate and said transparent substrate.

2. A hybrid integrated circuit device according to claim 1, further comprising a gas for preventing said light emitting element and/or said electrodes from deteriorating, said gas filling the space defined by said substrate, said transparent substrate and said seal.

3. A hybrid integrated circuit device according to claim 1, further comprising a spacer made of an insulating material which is disposed inside said seal between said hybrid integrated circuit substrate and said transparent substrate.

4. A hybrid integrated circuit device according to claim 1, wherein a light transmitting resin which is formed into a lens-like shape is disposed in said light emitting element.

5. A hybrid integrated circuit device according to claim 4, wherein a top portion of said light transmitting resin abuts against said transparent substrate.

6. A hybrid integrated circuit device according to claim 1, wherein said seal is made of a glossy material which reflects light emitted from said light emitting element.

7. A hybrid integrated circuit device according to claim 6, wherein said seal is made of a brazing material formed on a metal film which can be wet with the brazing material.

8. A hybrid integrated circuit device according to claim 1, wherein a filling hole for the gas is formed in said seal.

9. A hybrid integrated circuit device according to claim 1, further comprising an exhausting hole for a gas included inside said seal and a filling hole for the gas which are formed in said seal, wherein the exhausting hole and the filling hole are sealed after exhausting and filling a gas.

10. A hybrid integrated circuit device according to claim 1, wherein said gas is an inert gas.

11. A hybrid integrated circuit device according to claim 1, wherein the surface of the hybrid integrated circuit substrate is covered with solder resist.

12. A hybrid integrated circuit device according to claim 1 wherein:
said first electrode is formed on a region of said surface of the hybrid integrated circuit substrate and said first electrode is made of copper covered with an oxidation resistant metal;
said second electrode is formed on another region of said surface of the hybrid integrated circuit substrate and said second electrode is made of copper covered with an oxidation resistant metal;
a rear face of said light emitting element is electrically connected to said first electrode; and
further comprising an electrical connection between said second electrode and an electrode on a surface of said light emitting element.

13. A consolidated hybrid integrated circuit device comprising a plurality of hybrid integrated circuit devices according to claim 1 wherein:
said first electrode is formed on a region of said surface of the hybrid integrated circuit substrate and said first electrode is made of copper covered with an oxidation resistant metal;
said second electrode is formed on another region of said surface of the hybrid integrated circuit substrate and said second electrode is made of copper covered with an oxidation resistant metal;
a rear face of said light emitting element is electrically connected to said first electrode; and
further comprising an electrical connection between said second electrode and an electrode on a surface of said light emitting element; and
electrical connections between said first electrodes and between said second electrodes.

14. A consolidated hybrid integrated circuit device according to claim 13, wherein said hybrid integrated circuit substrates are arranged in a matrix array and at least end ones of said hybrid integrated circuit substrates are inclined at a predetermined angle with respect to a centrally located hybrid integrated circuit substrate.

15. A consolidated hybrid integrated circuit device according to claims 14, wherein the substrates are arranged in a matrix array and at least both end substrates is inclined in vertical and lateral directions so as to approximate a paraboloid, and an object to be heated is disposed in a focal point of the paraboloid.

16. A hybrid integrated circuit device comprising:
a hybrid integrated circuit substrate in which at least a surface is provided with insulation;
at least a first electrode and at least a second electrode formed on said surface and being disposed to cover substantially the substrate;
a light emitting element connected with the first and second electrodes, and said first and second electrodes configured to reflect light;
a seal which is disposed in a periphery of said substrate; and
a transparent substrate which is fixed to said hybrid integrated circuit substrate via said seal to enclose the first and second electrodes and the light emitting element within a sealed space formed between said hybrid integrated circuit substrate and said transparent substrate, wherein the hybrid integrated circuit substrate is made of glass.

17. A circuit device comprising:
a first substrate in which at least a surface is provided with insulation;
a first electrode and a second electrode formed on said surface;
a light emitting element connected to the first and second electrodes;
a driving circuit for driving said light emitting element;
a seal disposed in a periphery of said first substrate;
a second substrate comprising a transparent substrate which is fixed to said first substrate through said seal to enclose said first and second electrodes, said light emitting element and said driving circuit within a sealed space formed between said first substrate and said second substrate; and
a spacer to keep the first and the second substrates apart.

18. The circuit device according to claim 17, wherein said first substrate comprises a glass substrate or a transparent substrate.

19. The circuit device according to claim 18, wherein said second substrate is made of glass, and said spacer keeps a distance between said first substrate and said second substrate constant.

20. The circuit device according to claim 17, wherein a gas for preventing said light emitting element and said driving circuit from deteriorating is filled into the sealed space formed between said first substrate and said second substrate.

21. The circuit device according to claim 17, wherein said first substrate comprises a hybrid integrated circuit substrate.

* * * * *